US012257608B2

(12) United States Patent
Liu (10) Patent No.: US 12,257,608 B2
(45) Date of Patent: Mar. 25, 2025

(54) SEMICONDUCTOR PROCESSING APPARATUS AND DIELECTRIC WINDOW CLEANING METHOD OF SEMICONDUCTOR PROCESSING APPARATUS

(71) Applicant: BEIJING NAURA MICROELECTRONICS EQUIPMENT CO., LTD., Beijing (CN)

(72) Inventor: Chunming Liu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 322 days.

(21) Appl. No.: 17/788,650

(22) PCT Filed: Dec. 16, 2020

(86) PCT No.: PCT/CN2020/136654
§ 371 (c)(1),
(2) Date: Jun. 23, 2022

(87) PCT Pub. No.: WO2021/129471
PCT Pub. Date: Jul. 1, 2021

(65) Prior Publication Data
US 2023/0032679 A1 Feb. 2, 2023

(30) Foreign Application Priority Data
Dec. 26, 2019 (CN) .......................... 201911371199.8

(51) Int. Cl.
*H01J 37/32* (2006.01)
*B08B 7/00* (2006.01)
*B08B 13/00* (2006.01)

(52) U.S. Cl.
CPC ............ *B08B 7/0035* (2013.01); *B08B 13/00* (2013.01); *H01J 37/32091* (2013.01);
(Continued)

(58) Field of Classification Search
CPC ........... H01J 37/32183; H01J 37/32091; H01J 37/32541; H01J 37/32119;
(Continued)

(56) References Cited

U.S. PATENT DOCUMENTS

| 6,447,636 B1 * | 9/2002 | Qian | H01J 37/32009 |
| | | | 156/345.48 |
| 2002/0185228 A1 * | 12/2002 | Chen | H01J 37/32174 |
| | | | 156/345.48 |

(Continued)

FOREIGN PATENT DOCUMENTS

| CN | 110223904 A | 9/2019 |
| CN | 110459456 A | 11/2019 |

(Continued)

OTHER PUBLICATIONS

The World Intellectual Property Organization (WIPO) International Search Report for PCT/CN2020/136654 Mar. 17, 2021 6 Pages (including translation).

*Primary Examiner* — Yuechuan Yu
(74) *Attorney, Agent, or Firm* — ANOVA LAW GROUP, PLLC (57) ABSTRACT

Embodiments of the present disclosure provide a semiconductor processing apparatus and a dielectric window cleaning method of the semiconductor processing apparatus. The semiconductor apparatus includes a reaction chamber and a dielectric window arranged in the reaction chamber, an induction coil and a cleaning electrode, both located above the dielectric window, a radio frequency (RF) source assembly configured to apply RF power to the induction coil and
(Continued)

the cleaning electrode, an impedance adjustment assembly electrically being connected to the cleaning electrode and being in an on-off connection to the output terminal of the RF source assembly. The semiconductor processing apparatus and the dielectric window cleaning method of the semiconductor processing apparatus of embodiments of the present disclosure can achieve a physical cleaning effect and a chemical cleaning effect at simultaneously on a basis of performing cleaning on the dielectric window. Thus, the cleaning efficiency of the dielectric window is effectively improved.

9 Claims, 5 Drawing Sheets

(52) U.S. Cl.
CPC ... *H01J 37/32119* (2013.01); *H01J 37/32183* (2013.01); *H01J 37/32541* (2013.01); *H01J 37/32568* (2013.01); *H01J 2237/24564* (2013.01); *H01J 2237/335* (2013.01)

(58) Field of Classification Search
CPC .......... H01J 37/32568; H01J 2237/335; H01J 2237/24564; B08B 7/0035; B08B 13/00; Y02P 70/50

See application file for complete search history.

(56) References Cited

U.S. PATENT DOCUMENTS

| | | | |
|---|---|---|---|
| 2013/0119863 A1* | 5/2013 | Hanawa | H01J 37/32183 315/111.21 |
| 2014/0345645 A1 | 11/2014 | Hoinkis et al. | |
| 2017/0076921 A1* | 3/2017 | Sakiyama | H01J 37/32935 |
| 2020/0035468 A1* | 1/2020 | Momiyama | H01J 37/32715 |

FOREIGN PATENT DOCUMENTS

| | | | |
|---|---|---|---|
| CN | 110491759 A | | 11/2019 |
| CN | 111048396 A | | 4/2020 |
| JP | 2013033860 A | * | 2/2013 |
| JP | 2014216318 A | | 11/2014 |
| TW | 200823977 A | | 6/2008 |
| WO | 2008149741 A1 | | 12/2008 |

\* cited by examiner

SEMICONDUCTOR PROCESSING APPARATUS AND DIELECTRIC WINDOW CLEANING METHOD OF SEMICONDUCTOR PROCESSING APPARATUS

CROSS-REFERENCE TO RELATED APPLICATIONS

This application is a national phase entry under 35 U.S.C. § 371 of International Application No. PCT/CN2020/136654, filed on Dec. 16, 2020, which claims priority to Chinese Application No. 201911371199.8 filed Dec. 26, 2019, the entire contents of all of which are incorporated herein by reference.

TECHNICAL FIELD

The present disclosure generally relates to the semiconductor processing field and, more particularly, to a semiconductor processing apparatus and a dielectric window cleaning method of the semiconductor processing apparatus.

BACKGROUND

A semiconductor processing apparatus is configured to process a workpiece (such as a wafer). For example, when the semiconductor processing apparatus performs etching on the workpiece, a reaction by-product generated by the etching, a thin film generated by plasma bombarding the workpiece, or a solid sputtered from the workpiece will be adhered to an inner wall of a chamber and a dielectric window. The dielectric window is used as a channel for feeding RF power into the chamber. Deposition of a adhered material at the dielectric window will significantly affect a process result of the workpiece. However, cleaning efficiency of the current semiconductor processing apparatus for the dielectric window is not sufficient, which causes a short maintenance cycle for the chamber.

SUMMARY

Embodiments of the present disclosure provide a semiconductor processing apparatus and a dielectric window cleaning method of the semiconductor processing apparatus to solve the problems in the background, such as avoiding deposition of an adhered material on the dielectric window from affecting a process result of a workpiece.

According to an embodiment of the present disclosure, a semiconductor processing apparatus is disclosed and includes:
  a reaction chamber and a dielectric window arranged in the reaction chamber;
  an induction coil and a cleaning electrode both located above the dielectric window;
  a radio frequency (RF) source assembly, the RF source assembly being configured to apply RF power to the induction coil and the cleaning electrode;
  an impedance adjustment assembly, the impedance adjustment assembly being electrically connected to the cleaning electrode and being in an on-off connection with an output terminal of the RF source assembly, and the impedance adjustment assembly being configured to adjust an impedance between the output terminal of the radio frequency source assembly and the cleaning electrode to cause the impedance to be greater or smaller than a first predetermined value to disconnect or connect the impedance adjustment assembly and the output terminal of the RF source assembly.

In some embodiments, the impedance adjustment assembly includes a variable capacitor, an end of the variable capacitor being coupled to the cleaning electrode, and another end of the variable capacitor being in an on-off connection to the output terminal of the RF source.

In some embodiments, the impedance adjustment assembly further includes:
  a sensor, an end of the sensor being coupled to the cleaning electrode, the sensor being configured to sense a voltage value of the cleaning electrode and output a control signal according to the voltage value; and
  a control assembly, an end of the control assembly being coupled to the sensor, another end of the control assembly being coupled to the variable capacitor, and the control assembly being configured to adjust a capacitance value of the variable capacitor according to the control signal.

In some embodiments, the sensor includes a dual-channel visual recognition sensor, the visual recognition sensor includes a first end and a second end, the first end is coupled to the cleaning electrode and configured to sense the voltage value of the cleaning electrode and output the control signal according to the voltage value, the second end is coupled to the output terminal of the RF source assembly and configured to sense an output voltage of the RF source assembly and output a control signal according to the output voltage.

In some embodiments, the control assembly includes a step motor, the step motor being configured to adjust the capacitance value by adjusting a capacitance position of the variable capacitor.

In some embodiments, the impedance adjustment assembly further includes:
  a switch, an end of the switch being coupled to the variable capacitor, another end of the switch being coupled to the output terminal of the RF source assembly, and the switch being configured to control on and off of the impedance adjustment assembly and the output terminal of the RF source assembly.

In some embodiments, the RF source assembly includes an RF source and a matching circuit, the RF source applying RF power to the induction coil and the cleaning electrode through the matching circuit.

In some embodiments, the cleaning electrode has a pore structure, and porosity of the pore structure is greater than 90%.

According to another embodiment of the present disclosure, a dielectric window cleaning method of a semiconductor processing apparatus is disclosed, the semiconductor processing apparatus includes:
  a reaction chamber and a dielectric window arranged in the reaction chamber;
  an induction coil and a cleaning electrode both located above the dielectric window;
  a radio frequency (RF) source assembly, the RF source assembly being configured to apply RF power to the induction coil and the cleaning electrode;
  an impedance adjustment assembly, the impedance adjustment assembly being electrically connected to the cleaning electrode and being in an on-off connection with an output terminal of the RF source assembly, and the impedance adjustment assembly being configured to adjust an impedance between the output terminal of the radio frequency source assembly and the cleaning electrode to cause the impedance to be greater or smaller than a first predetermined value to disconnect or connect the impedance adjustment assembly and the output terminal of the RF source assembly; and the cleaning method includes:

adjusting the impedance between the output terminal of the RF source assembly and the cleaning electrode by the impedance adjustment assembly to cause the impedance to be greater than the first predetermined value to disconnect the impedance adjustment assembly from the output terminal of the RF source assembly to ignite a plasma in the reaction chamber; and adjusting the impedance by the impedance adjustment assembly to cause the impedance to be smaller than the first predetermine value to connect the impedance adjustment assembly to the output terminal of the RF source assembly to maintain the plasma to perform cleaning on the dielectric window.

In some embodiments, the impedance adjustment assembly includes a variable capacitor, an end of the variable capacitor being coupled to the cleaning electrode, and another end of the variable capacitor being in an on-off connection to the output terminal of the RF source; and adjusting the impedance by the impedance adjustment assembly specifically includes:

adjusting the impedance by adjusting a capacitance value of the variable capacitor.

In some embodiments, the capacitance value of the variable capacitor ranges from 10 pF to 500 pF.

In some embodiments, the impedance adjustment assembly further includes:

a sensor, an end of the sensor being coupled to the cleaning electrode, the sensor being configured to sense a voltage value of the cleaning electrode and output a control signal according to the voltage value; and a control assembly, an end of the control assembly being coupled to the sensor, another end of the control assembly being coupled to the variable capacitor, and the control assembly being configured to adjust a capacitance value of the variable capacitor according to the control signal; and adjusting the impedance by adjusting the capacitance value of the variable capacitor specifically includes:

sensing a voltage value of the cleaning electrode by the sensor and outputting a control signal according to the voltage value; and adjusting the capacitance value of the variable capacitor by the control assembly according to the control signal.

In some embodiments, the impedance adjustment assembly further includes:

a switch, an end of the switch being coupled to the variable capacitor, another end of the switch being coupled to the output terminal of the RF source assembly, and the switch being configured to control on and off of the impedance adjustment assembly and the output terminal of the RF source assembly;

the cleaning method further includes:

controlling on and off of the impedance adjustment assembly and the output terminal of the RF assembly by the switch.

In some embodiments, two ends of the variable capacitor have a voltage difference, and a ratio of the voltage difference to the voltage value of the cleaning electrode ranges from 0.1 to 10.

In some embodiments, the first predetermined value ranges from 1800 ohms to 2200 ohms.

In some embodiments, the first predetermined value is 2000 ohms.

In some embodiments, adjusting the impedance by the impedance adjustment assembly to cause the impedance to be smaller than the first predetermined value specifically includes:

adjusting the impedance by the impedance adjustment assembly to cause the impedance to be equal to a second predetermined value, the second predetermined value being smaller than the first determined value, and being sufficient to attract the plasma to move toward the dielectric window to perform cleaning on the dielectric window.

In some embodiments, the second predetermined value ranges from 100 ohms to 150 ohms.

In some embodiments, the plasma includes a first plasma generated by ionizing a first cleaning gas and a second plasma generated by ionizing a second cleaning gas, the first cleaning gas includes argon, and the second cleaning gas includes oxygen and sulfur hexafluoride.

In the technical solution of the semiconductor processing apparatus and the dielectric window cleaning method of the semiconductor processing apparatus of embodiments of the present disclosure, the impedance adjustment assembly may be disconnected from or connected to the output terminal of the RF source assembly by adjusting the impedance between the output terminal of the RF source assembly and the cleaning electrode through the impedance adjustment assembly to cause the impedance to be greater than or smaller than the first predetermined value. When the impedance adjustment assembly is disconnected from the output terminal of the RF source assembly, most of the RF power may be applied to the induction coil to ignite the plasma in the reaction chamber. When the impedance adjustment assembly is connected to the output terminal of the RF source assembly, the RF power may be applied to both the induction coil 14 and the cleaning electrode 15 simultaneously. Thus, on the basis of cleaning the dielectric window, the physical cleaning effect and the chemical cleaning effect may be simultaneously achieved to effectively improve the cleaning efficiency of the dielectric window and avoid the adhered material on the dielectric window affecting the process result of the workpiece.

DETAILED DESCRIPTION OF THE EMBODIMENTS

The following disclosure provides various embodiments or examples, which can be used to implement various features of the present disclosure. Examples of the assembly and configuration described below are used to simplify the present disclosure. It can be understood that these descriptions are only exemplary and are not intended to limit the present disclosure. For example, in the following description, forming a first feature on or over a second feature may include that, in some embodiments, the first feature and the second feature are in direct contact with each other, and, in some other embodiments, an additional assembly is formed between the first feature and the second feature described above, such that the first feature and the second feature may not be in direct contact. Moreover, in embodiments of the present disclosure, a reference numeral and/or an identification numeral of the assembly may be reused. Such reuse is for brevity and clarity and does not represent a relationship between different embodiments and/or configurations discussed.

Moreover, the spatially relative terms such as "below," "under," "beneath," "above," "over," and the like may be used to facilitate the description of a relationship between one assembly or feature relative to another assembly or feature shown in the drawings. These spatially relative terms are intended to include various orientations of the device in use or operation in addition to the orientation shown in the drawings. The device may be positioned in another orientation (e.g., rotated 90 degrees or at another orientation). Then, these spatially relative terms should be interpreted accordingly.

Although numerical ranges and parameters used to define a relatively broad scope of the present disclosure are approximations, related numerical values of specific embodiments have been presented as precisely as possible. However, any numerical value inherently contains a standard deviation resulting from an individual test method. As used herein, "about" generally means that an actual value is within plus or minus 10%, 5%, 1%, or 0.5% of a particular value or range. Alternatively, the word "about" means that the actual value is within an acceptable standard error of an average value, which is determined according to consideration by those of ordinary skill in the art of the present disclosure. It should be understood that, except in an experimental example, or unless otherwise specified, all ranges, quantities, numerical values, and percentages used herein (for example, to describe an amount of material, length of time, temperature, operation condition, quantity ratio, and other alike) are modified by "about." Therefore, unless otherwise specified to the contrary, the numerical parameters disclosed in the specification and the appended claims are approximate numerical values and may be changed as needed. These numerical parameters at least should be understood as indicated significant digits and values obtained by applying ordinary rounding. Here, the numerical ranges are represented as from one endpoint to another endpoint or between the two endpoints. Unless otherwise specified, all the numerical ranges described herein include the endpoints.

A semiconductor processing apparatus may be configured to process a workpiece (such as a wafer). For example, when the semiconductor processing apparatus performs etching on the workpiece, a reaction by-product generated by the etching, a thin film generated by plasma bombarding the workpiece, or a solid sputtered by the workpiece will be adhered to an inner wall of a chamber and a dielectric window. The dielectric window may be used as a channel for feeding radio frequency (RF) power into the chamber. Deposition of an adhered material will significantly affect a process result of the workpiece. In detail, if the workpiece includes metal or has a metal film layer. When the workpiece is processed, metal particles will be sputtered onto the dielectric window, and other by-products will adhere around the metal particles. When an external condition changes, the metal particles fall off with the by-products and form a pollution source. In addition, the metal particles adhered to the dielectric window will form a metal film layer similar to a Faraday shield. The metal film layer will change the coupling of the RF power, which causes a problem such as a difficulty in plasma ignition and changes in plasma composition. Thus, the process result of processing the workpiece may be affected.

Embodiments of the present disclosure provide a semiconductor processing apparatus and a method for cleaning a dielectric window of the semiconductor processing apparatus, which can improve the cleaning efficiency of the dielectric window and prevent deposition of an adhered material on the dielectric window from affecting the process result of the workpiece.

Figure 1:
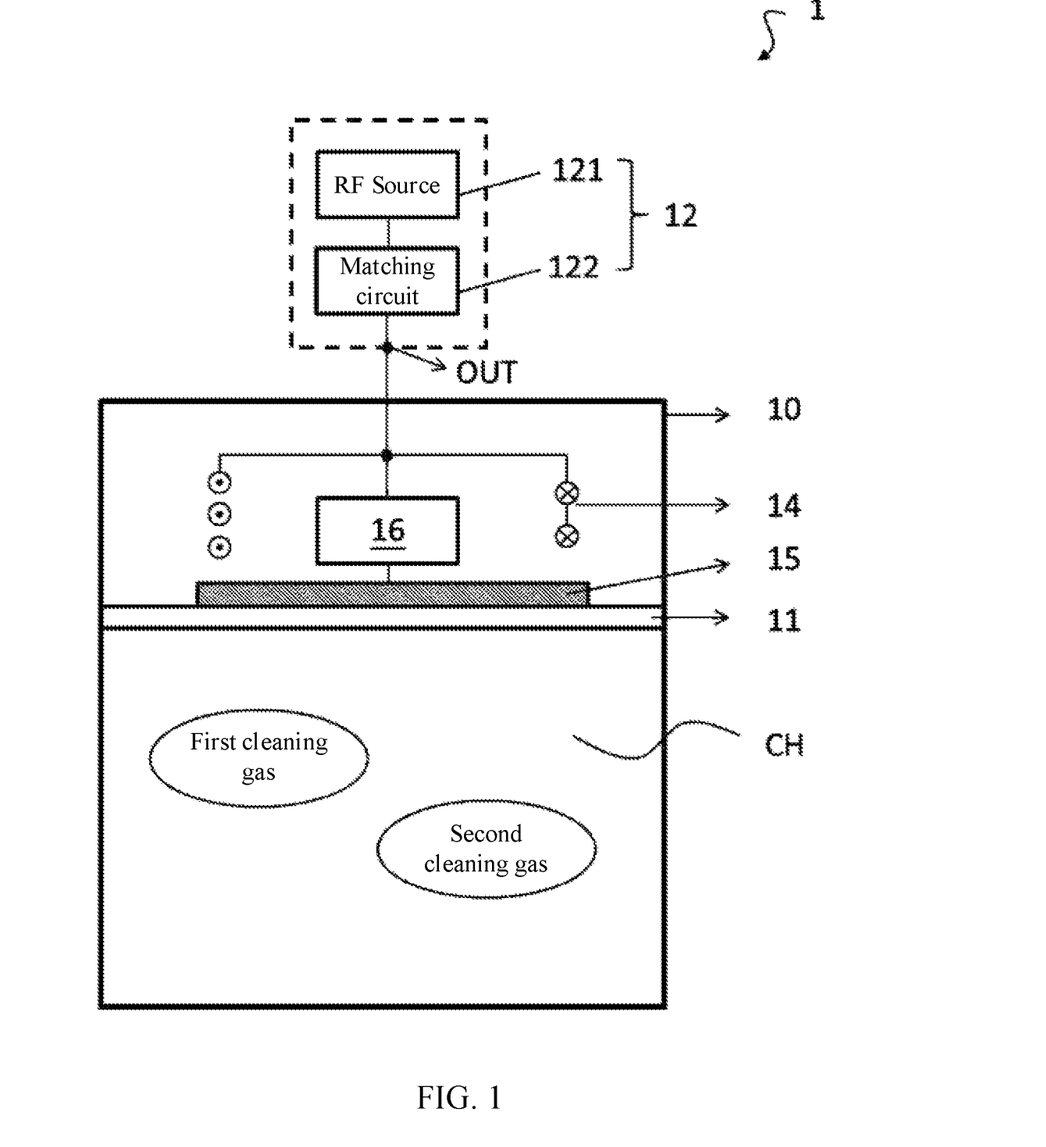
FIG. 1 is a schematic structural diagram of a semiconductor processing apparatus according to some embodiments of the present disclosure.

FIG. 1 is a schematic structural diagram of a semiconductor processing apparatus 1 according to some embodiments of the present disclosure. The semiconductor processing apparatus 1 is configured to process a workpiece. For example, the semiconductor processing apparatus 1 may be an etching device, which may be configured to perform an etching process on the workpiece and a cleaning process on a dielectric window. Specifically, the semiconductor processing apparatus 1 includes a housing 10, a dielectric window 11, a radio frequency (RF) source assembly 12, an induction coil 14, a cleaning electrode 15, and an impedance adjustment assembly 16. A space enclosed by the housing 10 is defined as a reaction chamber CH. The dielectric window 11 is arranged in the reaction chamber CH.

The RF source assembly 12, the induction coil 14, the cleaning electrode 15, and the impedance adjustment assembly 16 may form a cleaning mechanism for cleaning the dielectric window 11. The RF source assembly 12 includes an RF source 121, a matching circuit 122, and an output terminal OUT. The RF source 121 is coupled to the induction coil 14 through the matching circuit 122 via the output terminal OUT and is coupled to the cleaning electrode 15 through the impedance adjustment assembly 16. Thus, RF power may be applied to the induction coil 14 and the cleaning electrode 15 through the matching circuit 122. The matching circuit 122 may be configured to match an impedance behind the RF source 121 so that the RF power output by the RF source 121 may have maximum coupling efficiency. Both the induction coil 14 and the cleaning electrode 15 are arranged above the dielectric window 11.

Further, the impedance adjustment assembly 16 may be electrically connected to the cleaning electrode 15 and may be in an on-off connection to the output terminal OUT of the RF source assembly 12. The impedance adjustment assembly 16 may be configured to adjust an impedance between the output terminal OUT of the RF source assembly 12 and the cleaning electrode 15. Thus, the impedance adjustment assembly 16 may be connected to or disconnected from the output terminal OUT of the RF source assembly 12 by causing the impedance to be greater than or less than a first predetermined value. The cleaning electrode 15 may include a conductive material. For example, the cleaning electrode 15 may be a metal electrode. It should be noted that, in the present disclosure, the term "coupling" is not limited to direct and physical connection. The term "coupling" may represent indirect and non-physical connection through another third party.

When the semiconductor processing apparatus 1 performs the cleaning process on the dielectric window 11, first, the impedance between the cleaning electrode 15 and the output terminal OUT may be adjusted by the impedance adjustment assembly 16. Thus, the impedance may be greater than the first predetermined value, which causes an electrical path between the cleaning electrode 15 and the output terminal OUT to be disconnected. As such, most of the RF power generated by the RF source assembly 12 may be applied to the induction coil 14. The induction coil 14 may couple the RF power to a bottom of the dielectric window 11 in the manner of inductive coupled plasma (hereinafter referred to as ICP), so as to ignite the plasma in the reaction chamber CH.

Next, the impedance between the cleaning electrode 15 and the output terminal OUT may be adjusted by the impedance adjustment assembly 16 to cause the impedance to be smaller than the first predetermined value. Thus, the electrical path between the cleaning electrode 15 and the output terminal OUT may be connected. As such, the RF power generated by the RF source assembly 12 may be simultaneously applied on the induction coil 14 and the cleaning electrode 15. The RF power applied on the cleaning electrode 15 may generate a bias voltage on the cleaning electrode 15 to attract the plasma to move toward the dielectric window 11, so as to clean the dielectric window 11. In some embodiments, when the bias voltage is in the range of 1200 volts to 1800 volts, the plasma may be attracted more smoothly. Preferably, the bias voltage may be 1500 volts.

In some embodiments, during the cleaning process, a first cleaning gas and a second cleaning gas may be introduced into the reaction chamber CH. The two cleaning gases may be ionized to generate a first plasma and a second plasma, respectively, which may be used to achieve a physical cleaning effect and a chemical cleaning effect, respectively. In some embodiments, the first cleaning gas may include argon gas. After the first cleaning gas is ionized into the first plasma, argon ions included in the first plasma may be attracted by the biased voltage of the cleaning electrode 15 to move toward the dielectric window 11, so as to bombard the metal particles on the dielectric window 11 to achieve the physical cleaning effect. In some embodiments, the second cleaning gas may include oxygen and sulfur hexafluoride. After the second cleaning gas is ionized into the second plasma, oxygen ions and fluorine ions included in the second plasma may be attracted by the bias voltage on the cleaning electrode 15 to move toward the dielectric window 11, so as to react with the by-products except for the metal particles on the dielectric window 11 to achieve the chemical cleaning effect. It can be seen from the above that by attracting the plasma to move toward the dielectric window 11 through the cleaning electrode 15, the metal particles on the dielectric window 11 may be bombarded, and the processing by-products other than the metal particles may be reacted, so as to achieve the physical cleaning effect and chemical cleaning effect, respectively.

In detail, when the semiconductor processing apparatus 1 performs the cleaning on the dielectric window 11, first, in order to ignite the plasma, the impedance adjustment assembly 16 may be used to adjust the impedance between the cleaning electrode 15 and the output terminal OUT to be greater than the first predetermined value. When the impedance is greater than the first predetermined value, the electrical path between the cleaning electrode 15 and the output terminal OUT may be disconnected, and the cleaning electrode 15 may be in a floating state. In some embodiments, the first predetermined value may be in a range of 1800 ohms to 2200 ohms. The range may ensure that the electrical path between the cleaning electrode 15 and the output terminal OUT is disconnected. Preferably, the first predetermined value may be approximately 2000 ohms. Since the electrical path between the cleaning electrode 15 and the matching circuit 122 is disconnected, most of the RF power generated by the RF source 121 through the matching circuit 122 may be applied to the induction coil 14. The induction coil 14 may couple the RF power to the bottom of the dielectric window 11 in the ICP manner to ionize the first cleaning gas into the first plasma and ionize the second cleaning gas into the second plasma. It should be noted that when an internal air pressure of the reaction chamber CH is 50 mtorr, the output power of the RF source 121 is 1500 watts, and the impedance between the cleaning electrode 15 and the output terminal OUT is 2000 ohms, the bias voltage on the cleaning electrode 15 may reach 200 volts through the coupling effect of the RF power. The bias voltage may be relatively small. Thus, most of the RF power may be applied to the induction coil 14 to realize ICP ignition. It is easy to understand that when the bias voltage on the cleaning electrode 15 is small enough, most of the RF power may be applied to the induction coil 14. This situation may be regarded as that the electrical path between the cleaning electrode 15 and the output terminal OUT may be disconnected.

Next, the impedance adjustment assembly 16 may be configured to adjust the impedance between the cleaning electrode 15 and the output terminal OUT to be less than the first predetermined value. Thus, the electrical path between the cleaning electrode 15 and the output terminal OUT may be connected. Since the electrical path between the cleaning electrode 15 and the output terminal OUT is connected, the RF power generated by the RF source assembly 12 may be partially applied on the cleaning electrode 15 to increase the bias voltage on the cleaning electrode 15. When the impedance adjustment assembly 16 is used to adjust the impedance of the electrical path between the cleaning electrode 15 and the output terminal OUT to be a second predetermined value, the bias voltage on the cleaning electrode 15 may attract the first plasma and the second plasma to move toward the dielectric window 11 to clean the dielectric window 11.

In some embodiments, the second predetermined value may be smaller than the first predetermined value and may be sufficient to attract the plasma to move toward the dielectric window, so as to perform the cleaning on the dielectric window. In some embodiments, the second predetermined value may range from 100 ohms to 150 ohms. Preferably, the second predetermined value may be about 133 ohms. It should be noted that when an internal pressure of the reaction chamber CH is 50 mtorr, output power of the RF source 121 is set to 1500 watts, and the impedance between the cleaning electrode 15 and the output terminal OUT is 133 ohms, the bias voltage on the cleaning electrode 15 may be about 1500 volts. Thus, the cleaning electrode 15 may smoothly attract the first plasma and the second plasma to move toward the dielectric window 11 to clean the dielectric window 11.

Since physical cleaning and chemical cleaning are performed simultaneously in embodiments of the present disclosure, the cleaning efficiency of the dielectric window 11 may be effectively improved, and the adhered material on the dielectric window 11 may be prevented from affecting the process result of the workpiece.

It should be noted that those skilled in the art should be able to easily understand that the semiconductor processing apparatus 1 may also include another device and assembly to realize the processing of the workpiece. For example, the semiconductor processing apparatus 1 may further include an air inlet channel, which is configured to introduce the first cleaning gas and the second cleaning gas into the reaction chamber CH. For another example, the semiconductor processing apparatus 1 may further include a lower electrode platform arranged in the reaction chamber CH, which is configured to carry the workpiece when the semiconductor processing apparatus 1 performs the processing on the workpiece. For brevity of illustration, embodiments shown in FIG. 1 mostly illustrate a device and assembly related to the spirit of the present disclosure.

Figure 2:
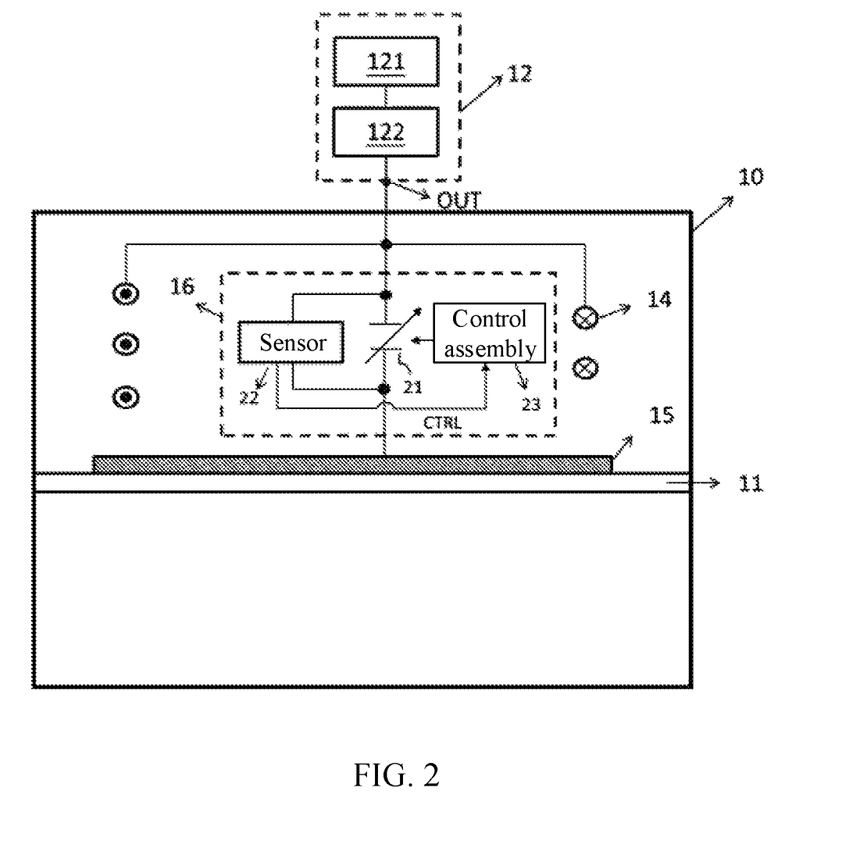
FIG. 2 is a schematic structural diagram of an impedance adjustment assembly according to some embodiments of the present disclosure.

FIG. 2 is a schematic structural diagram of an impedance adjustment assembly 16 according to some embodiments of the present disclosure. As shown in FIG. 2, the impedance adjustment assembly 16 includes a variable impedance 21, a sensor 22, and a control assembly 23. The variable impedance 21 includes a variable capacitance. However, this is not a limitation of embodiments of the present disclosure. Those skilled in the art should easily understand that, as long as the purpose of adjusting the impedance between the cleaning electrode 15 and the output terminal OUT can be achieved, the variable impedance 21 is not limited to the variable capacitor. In some embodiments, the variable impedance 21 may include a variable resistance or variable inductance. Embodiments of the present disclosure are described in the following paragraphs by taking the variable capacitor 21 as an example. In some embodiments, a capacitance value of the variable capacitor 21 may be in a range of 10 pF to 500 pF. An end of the variable capacitor 21 is coupled to the cleaning electrode 15. The other end of the variable capacitor 21 is in an on-off connection to the output terminal OUT. By adjusting the capacitance value of the variable capacitor 21, the impedance adjustment assembly 16 can achieve the purpose of adjusting the impedance between the cleaning electrode 15 and the output terminal OUT.

One end of the sensor 22 is coupled to the cleaning electrode 15. The other end of the sensor 22 is coupled to the output terminal OUT. The sensor 22 may be connected in parallel with the variable capacitor 21. The sensor 22 may be configured to sense the bias voltage on the cleaning electrode 15 and output a control signal CTRL according to the bias voltage. An end of a control assembly 23 is coupled to the sensor 22. The other end of the control assembly 23 is coupled to the variable capacitor 21. The control assembly 23 may be configured to adjust the capacitance value of the variable capacitor 21 according to the control signal CTRL. In some embodiments, the sensor 22 includes a dual-channel visual recognition sensor (VI-sensor), which may be configured to sense the bias voltage on the cleaning electrode 15 and output the control signal CTRL. The visual recognition sensor may also be configured to sense the output voltage of the matching circuit 122 and output the control signal CTRL. By sensing the output voltage of the matching circuit 122, a problem such as ignition caused by an excessively large output voltage of the matching circuit 122 may be avoided.

In some embodiments, the control assembly 23 may include a step motor capable of controlling a capacitance position of the variable capacitor 21, which may be configured to adjust the capacitance value of the variable capacitor 21 by adjusting the capacitance position of the variable capacitor 21 (i.e., change an effective capacitance of an access circuit) according to the control signal CTRL.

When the semiconductor processing apparatus 1 performs the cleaning on the dielectric window 11, first, the impedance adjustment assembly 16 may be used to adjust the capacitance value of the variable capacitor 21 to a first capacitance value, so as to adjust the impedance between the cleaning electrode 15 and the output terminal OUT to the first predetermined value. Preferably, the above-mentioned first capacitance value may be 10 pF. At this time, the impedance between the cleaning electrode 15 and the output terminal OUT may be about 2000 ohms (i.e., the first predetermined value). Thus, the electrical path between the cleaning electrode 15 and the matching circuit 122 may be disconnected. Most of the RF power generated by the RF source assembly 12 may be applied to the induction coil 14. The induction coil 14 may couple the RF power to the bottom of the dielectric window 11 in the ICP manner to ignite the plasma.

Next, the impedance adjustment assembly 16 may be configured to sense the bias voltage on the cleaning electrode 15 through the sensor 22 and output the control signal CTRL. Then, the impedance adjustment assembly 16 may be configured to adjust the capacitance value of the variable capacitor 21 through the control assembly 23 according to the control signal CTRL. Thus, the electrical path between the cleaning electrode 15 and the matching circuit 122 may be connected. The RF power generated by the RF source assembly 12 may be partially distributed to the cleaning electrode 15 to increase the bias voltage on the cleaning electrode 15.

In detail, the variable capacitor 21 and the cleaning electrode 15 are connected in series. When the electrical path between the cleaning electrode 15 and the matching circuit 122 is connected, the RF power may be distributed to the electrical power between the cleaning electrode 15 and the output terminal OUT. A voltage difference may be generated on the variable capacitor 21, and a bias voltage may be generated on the cleaning electrode 15. By increasing the capacitance value of the variable capacitor 21, an equivalent impedance of the variable capacitor 21 may be gradually reduced. Thus, the bias voltage generated on the cleaning electrode 15 may be increased accordingly.

In some embodiments, a ratio of the voltage difference between the two ends of the variable capacitor 21 to the bias voltage generated on the cleaning electrode 15 may range from 0.1 to 10.

When the capacitance value of the variable capacitor 21 is adjusted to the second capacitance value, the impedance between the cleaning electrode 15 and the output terminal OUT may be a second predetermined value. Preferably, the second capacitance value may be about 150 pF. At this time, the impedance between the cleaning electrode 15 and the output terminal OUT may be about 133 ohms (i.e., the second predetermined value). The bias voltage on the cleaning electrode 15 may be about 1500 volts. As such, the plasma may be attracted to move toward the dielectric window 11 to clean the dielectric window 11.

As shown in FIG. 2, when the semiconductor processing apparatus 1 performs the cleaning on the dielectric window 11, the impedance adjustment assembly 16 may be used to adjust the capacitance value of the variable capacitor 21 to the first capacitance value. As such, the electrical path between the cleaning electrode 15 and the matching circuit 122 may be disconnected. Further, in order to more effectively disconnect the electrical path between the cleaning electrode 15 and the matching circuit 122, the impedance adjustment assembly 16 is not limited to the structure shown in FIG. 2. For example, FIG. 3 is a schematic structural diagram of another impedance adjustment assembly 16 according to some embodiments of the present disclosure.

Figure 3:
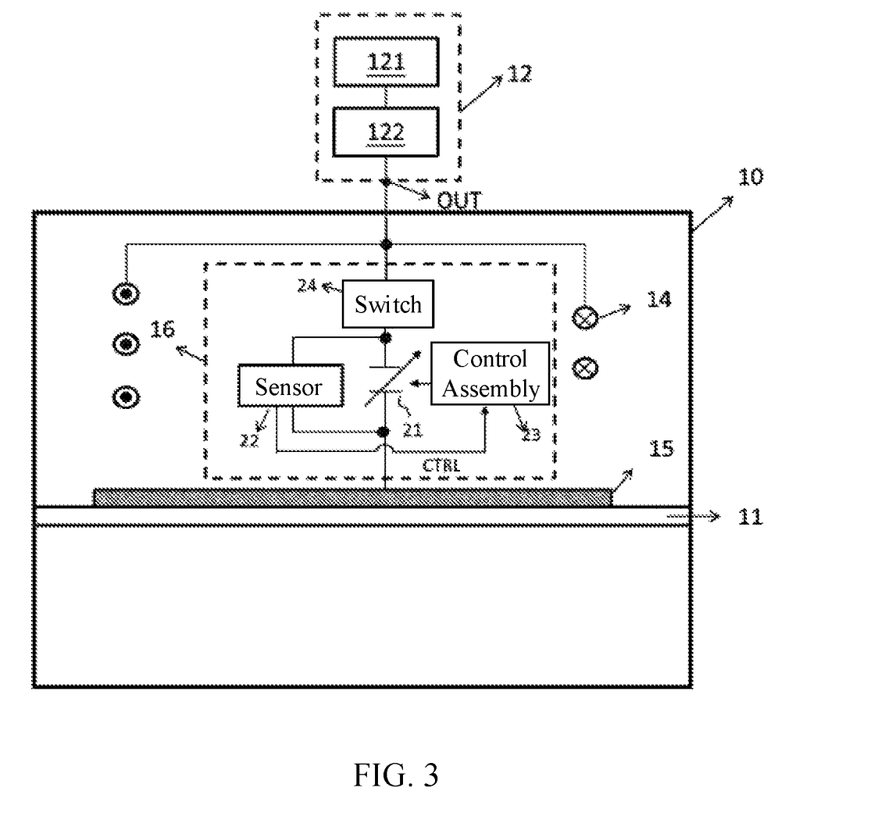
FIG. 3 is a schematic structural diagram of another impedance adjustment assembly according to some embodiments of the present disclosure.

As shown in FIG. 3, the impedance adjustment assembly 16 has substantially a same structure as the impedance adjustment assembly 16 shown in FIG. 2. An only difference is that the impedance adjustment assembly 16 shown in FIG. 3 additionally includes a switch 24. An end of the switch 24 is coupled to the output terminal OUT, and the other end of the switch 24 is coupled to the variable capacitor 21.

When the semiconductor processing apparatus 1 performs the cleaning on the dielectric window 11, the impedance adjustment assembly 16 may be used to turn off the switch 24. Thus, the electrical path between the cleaning electrode 15 and the output terminal OUT may be disconnected. When the control assembly 23 is used to adjust the capacitance value of the variable capacitor 21, the impedance adjustment assembly 16 may activate the switch 24 to connect the electrical path between the cleaning electrode 15 and the matching circuit 122. Those skilled in the art should be able to easily understand embodiments shown in FIG. 3 after reading the above paragraphs, and the detailed description is omitted here to save space.

Figure 4:
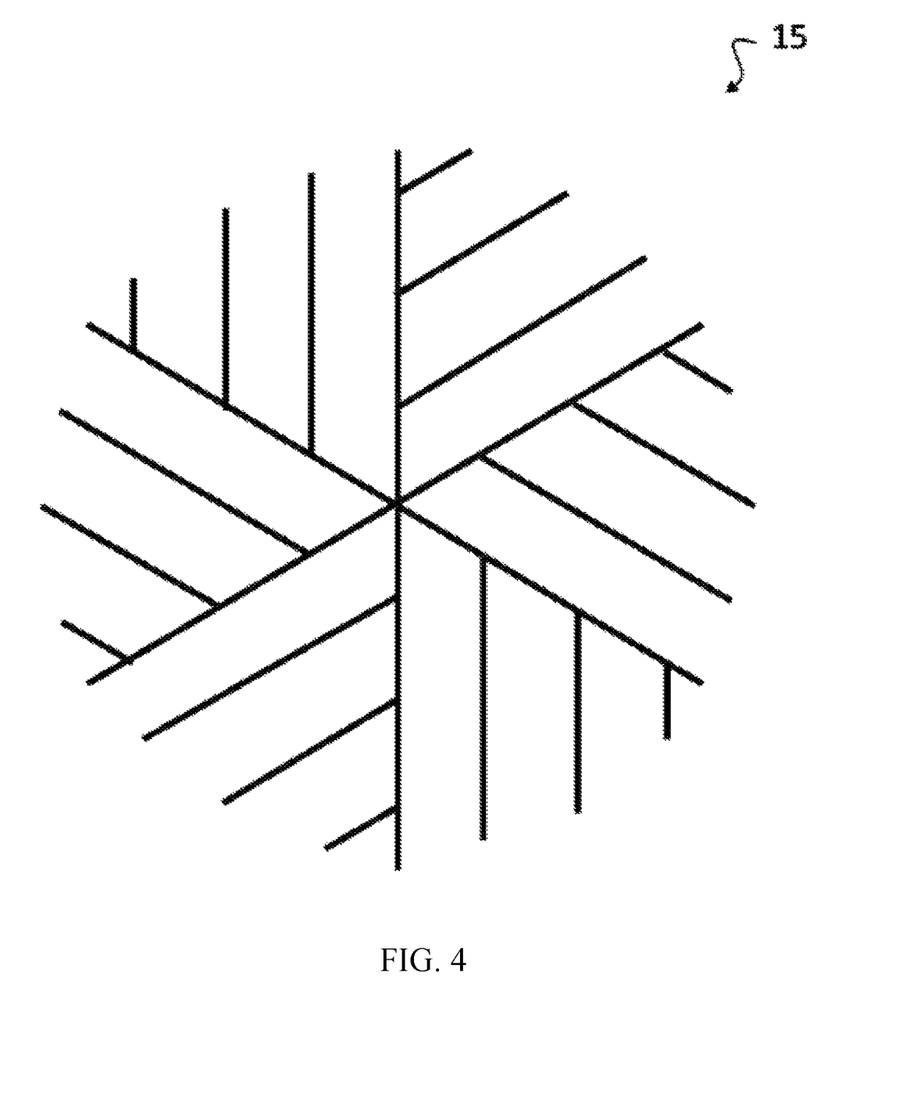
FIG. 4 is a schematic structural diagram of a cleaning electrode according to some embodiments of the present disclosure.

FIG. 4 is a schematic structural diagram of a cleaning electrode 15 according to some embodiments of the present disclosure. As shown in FIG. 4, the cleaning electrode 15 has a dendritic structure. In some embodiments, a porosity of the cleaning electrode 15 may be above 90%. It should be noted that as long as the porosity of the cleaning electrode 15 is above 90%, embodiments of the present disclosure do not limit the cleaning electrode 15 to the structure shown in FIG. 4. In some other embodiments, the cleaning electrode 15 may have a mesh structure or a star structure.

Figure 5:
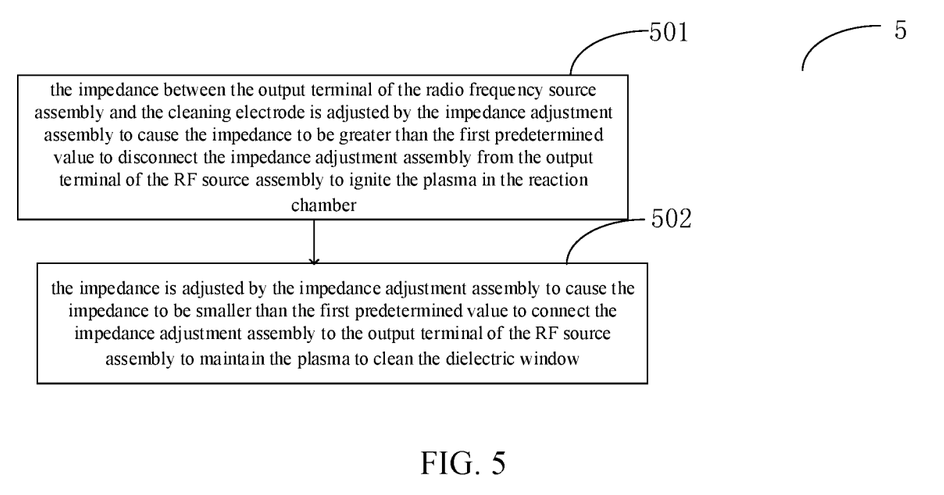
FIG. 5 is a schematic flowchart of a dielectric window cleaning method of a semiconductor processing apparatus according to some embodiments of the present disclosure.

FIG. 5 is a schematic flowchart of a dielectric window cleaning method 5 of a semiconductor processing apparatus according to some embodiments of the present disclosure. If a substantially same result may be obtained, embodiments of the present disclosure may not be limited to be performed according to process steps shown in FIG. 5. The cleaning method 5 may be applied to the semiconductor processing apparatus of embodiments of the present disclosure. The process of the cleaning method 5 may be roughly summarized as follows.

In step 501, the impedance between the output terminal of the radio frequency source assembly and the cleaning electrode is adjusted by the impedance adjustment assembly to cause the impedance to be greater than the first predetermined value to disconnect the impedance adjustment assembly from the output terminal of the RF source assembly to ignite the plasma in the reaction chamber.

In step 502, the impedance is adjusted by the impedance adjustment assembly to cause the impedance to be smaller than the first predetermined value to connect the impedance adjustment assembly to the output terminal of the RF source assembly to maintain the plasma to clean the dielectric window.

Those skilled in the art should be able to easily understand the flowchart shown in FIG. 5 after reading embodiments in FIG. 1 to FIG. 4, and the detailed description is omitted here to save space.

In summary, in the technical solution of the semiconductor processing apparatus and the dielectric window cleaning method of the semiconductor processing apparatus of embodiments of the present disclosure, the impedance adjustment assembly may be disconnected from or connected to the output terminal of the RF source assembly by adjusting the impedance between the output terminal of the RF source assembly and the cleaning electrode through the impedance adjustment assembly to cause the impedance to be greater than or smaller than the first predetermined value. When the impedance adjustment assembly is disconnected from the output terminal of the RF source assembly, most of the RF power may be applied on the induction coil to ignite the plasma in the reaction chamber. When the impedance adjustment assembly is connected to the output terminal of the RF source assembly, the RF power may be applied on the induction coil 14 and the cleaning electrode 15 simultaneously. Thus, on the basis of cleaning the dielectric window, the physical cleaning effect and the chemical cleaning effect may be simultaneously achieved. Therefore, the cleaning efficiency of the dielectric window may be effectively improved, and the adhered material of the dielectric window may be prevented from affecting the process result of the workpiece.

What is claimed is:

1. A semiconductor processing apparatus comprising:
 a reaction chamber and a dielectric window arranged in the reaction chamber;
 an induction coil and a cleaning electrode both located above the dielectric window, the cleaning electrode being under the induction coil;
 a radio frequency (RF) source assembly configured to apply RF power to the induction coil and the cleaning electrode; and
 an impedance adjustment assembly electrically connected to the cleaning electrode and being in an on-off connection with an output terminal of the RF source assembly, and the impedance adjustment assembly being configured to adjust an impedance between the output terminal of the RF source assembly and the cleaning electrode to cause the impedance to be greater or smaller than a first predetermined value to disconnect or connect the impedance adjustment assembly and the output terminal of the RF source assembly.

2. The semiconductor processing apparatus according to claim 1, wherein the impedance adjustment assembly includes:
 a variable capacitor, an end of the variable capacitor being coupled to the cleaning electrode, and another end of the variable capacitor being in an on-off connection to the output terminal of the RF source assembly.

3. The semiconductor processing apparatus according to claim 2, wherein the impedance adjustment assembly further includes:
 a sensor, an end of the sensor being coupled to the cleaning electrode, and the sensor being configured to sense a voltage value of the cleaning electrode and output a control signal according to the voltage value; and
 a control assembly, an end of the control assembly being coupled to the sensor, another end of the control assembly being coupled to the variable capacitor, and the control assembly being configured to adjust a capacitance value of the variable capacitor according to the control signal.

4. The semiconductor processing apparatus according to claim 3, wherein the sensor includes a dual-channel visual recognition sensor, including:
 a first end coupled to the cleaning electrode and configured to sense the voltage value of the cleaning electrode and output the control signal according to the voltage value; and
 a second end coupled to the output terminal of the RF source assembly and configured to sense an output voltage of the RF source assembly and output a control signal according to the output voltage.

5. The semiconductor processing apparatus according to claim 3, wherein the control assembly includes:
   a step motor configured to adjust the capacitance value by adjusting a capacitance position of the variable capacitor.

6. The semiconductor processing apparatus according to claim 2, wherein the impedance adjustment assembly further includes:
   a switch, an end of the switch being coupled to the variable capacitor, another end of the switch being coupled to the output terminal of the RF source assembly, and the switch being configured to control on and off of the impedance adjustment assembly and the output terminal of the RF source assembly.

7. The semiconductor processing apparatus according to claim 1, wherein the RF source assembly includes:
   a RF source; and
   a matching circuit, the RF source applying RF power to the induction coil and the cleaning electrode through the matching circuit.

8. The semiconductor processing apparatus according to claim 1, wherein:
   the cleaning electrode has a pore structure; and
   porosity of the pore structure is greater than 90%.

9. The semiconductor processing apparatus of claim 1, wherein: an RF source applies the RF power to the induction coil to ignite a plasma in the reaction chamber based on inductive coupling in response to the impedance being greater than the first predetermined value and the impedance adjustment assembly being disconnected from the output terminal of the RF source assembly, and the RF source applies the RF power to the induction coil and the cleaning electrode simultaneously in response to the impedance being smaller than the first predetermined value and the impedance adjustment assembly being connected to the output terminal of the RF source assembly, and the RF power applied to the cleaning electrode generates a bias voltage on the cleaning electrode to attract the plasma to the dielectric window to clean the dielectric window.

* * * * *